United States Patent
Ito

(10) Patent No.: US 6,804,156 B2
(45) Date of Patent: Oct. 12, 2004

(54) SEMICONDUCTOR INTEGRATED CIRCUIT DEVICE

(75) Inventor: Hiroshi Ito, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/320,686

(22) Filed: Dec. 17, 2002

(65) Prior Publication Data

US 2004/0066684 A1 Apr. 8, 2004

(30) Foreign Application Priority Data

Oct. 8, 2002 (JP) ........................................ 2002-295191

(51) Int. Cl.$^7$ ................................................ G11C 7/00
(52) U.S. Cl. ........................................ 365/201; 365/200
(58) Field of Search ................................ 365/201, 200

(56) References Cited

U.S. PATENT DOCUMENTS 5,430,679 A   7/1995   Hiltebeitel et al. ......... 365/200
6,320,800 B1 * 11/2001  Saito et al. ................. 365/200

FOREIGN PATENT DOCUMENTS

JP          11-7793        1/1999

OTHER PUBLICATIONS

Michael R. Ouellette, et al. "Shared Fuse Macro for Multiple Embedded Memory Devices with Redundancy," IEEE CICC Digest of Tech. Papers, 2001, pp. 191–194.

* cited by examiner

Primary Examiner—M. Tran
(74) Attorney, Agent, or Firm—Oblon, Spivak, McClelland, Maier & Neustadt, P.C.

(57) ABSTRACT

A semiconductor integrated circuit device includes a memory cell array in which a plurality of memory cells are arranged in an array, a redundant circuit which has a plurality of spare memory cells and replaces defective memory cells in the memory cell array with specific spare memory cells on the basis of programmed address information, a memory circuit with a plurality of nonvolatile memory elements and in which the address information is programmed, a transfer circuit which transfers the address information programmed in the memory circuit to the redundant circuit. The operation of the transfer circuit is controlled according to command information programmed in the memory circuit.

21 Claims, 8 Drawing Sheets

Address information (for Redundancy)

Effective data

Unused

Normally impossible pattern

Command

| opcode | operand |
|---|---|
| DataLength | The number of bits in data |
| Skip | The number of data items to be skipped |
| NoEval | The number of data items whose opcodes are not evaluated |

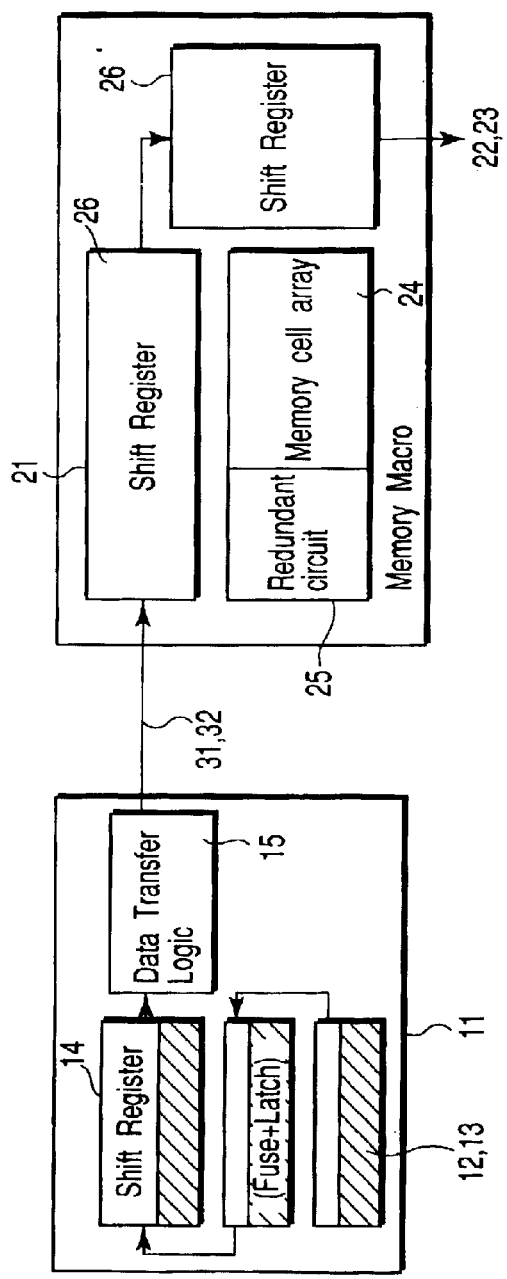
FIG. 4
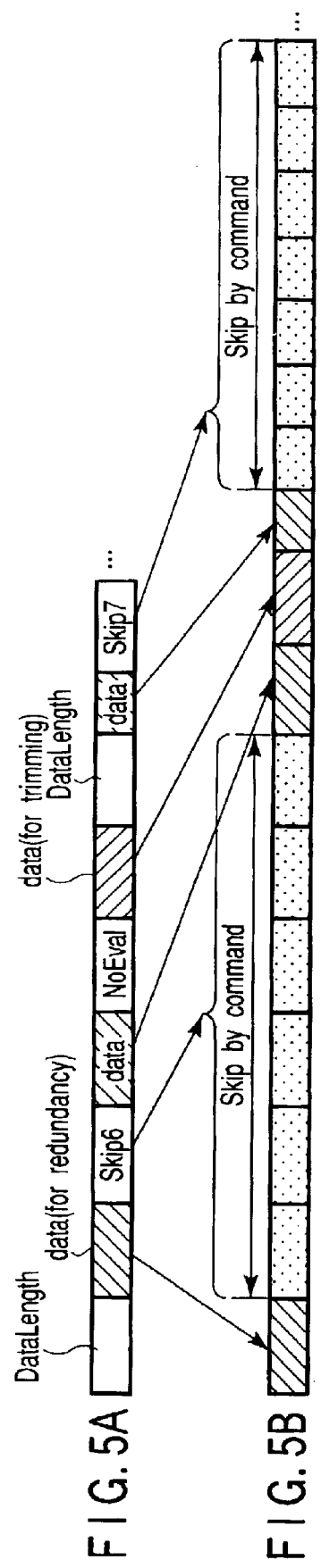
FIG. 5A
FIG. 5B

| opcode | operand |
|---|---|
| Trigger | Macro ID |
| DataLength | The number of bits in data |
| Skip | The number of data items to be skipped |
| NoEval | The number of data items whose opecodes are not evaluated |

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2002-295191, filed Oct. 8, 2002, the entire contents of which are incorporated herein by reference.

BACKGROUND OF THE INVENTION

1. Field of the Invention

The present invention relates to a semiconductor integrated circuit device. More particularly, the present invention relates to an embedded memory which causes a fuse box outside a memory macro to transfer address information for redundancy to the memory macro.

2. Description of the Related Art

In the field of ASIC (Application Specific Integrated Circuit), more and more embedded memories with large capacity have been used in recent years. With the increasing use of such memories, multimedia applications and SoC (System on Chip) have been realized.

In memory macros, such as DRAMs (Dynamic Random Access Memories) or SRAMs (Static RAMs), it is essential to provide a redundant circuit for relieving defective cells to produce acceptable products. The redundant circuit is such that, when a defect has been found in an ordinary cell, the defective cell is replaced with a spare memory cell, thereby relieving the defective cell. Generally, defective cells are replaced in units of a set of spare memory cells. That is, defective cells are relieved in rows, columns, or blocks.

To replace a defective cell with a spare, it is necessary to store an address (or a faulty address) specifying the defective cell. Such a faulty address is generally stored in an element called a fuse.

There are several types of fuses. In memory macros, such as DRAMs or SRAMs, optical fuses are generally used. An optical fuse is such that an interconnection line in a specific layer is fused by heat generated as a result of the projection of laser light. In the case of an optical fuse, one bit of data is stored, depending on whether the interconnection line is cut. Such optical fuses are mainly used in relieving the defective cells found in a test carried out before the chip is sealed into a package.

The element size (interconnection line width) of the optical fuse is determined by the wavelength of the laser light used. This prevents the element size from keeping pace with the miniaturization of the circuits in a chip. Consequently, the optical fuse is larger in size than a semiconductor element, such as a transistor. Furthermore, the optical fuse is such that laser light is projected directly onto the fuse to fuse it. Therefore, another interconnection line or connection electrode cannot be formed on the optical fuse. Generally, no circuit is provided under the optical fuse to prevent damage to the circuit due to physical destruction known as fusing.

For the above reasons, arranging optical fuses in a memory micro results in the occupation of a large area. In addition, the arrangement places strict restrictions on the floor plan or interconnection layout. A Flip Chip BGA (flip chip ball grid array) has a structure where the chip is connected directly to a wiring board via connection electrodes called bumps formed on the chip. As a result, when this package is selected, the following problem arises: bumps cannot be formed on the optical fuses.

To solve the above problem, the following method has been considered: optical fuses are provided together outside a memory macro and the fuse data stored in the individual optical fuses is transferred to the memory macro at the time of the initialization of the memory macro.

Hereinafter, a device into which optical fuses and a circuit necessary to read and transfer the fuse data are placed together is referred to as a fuse box. The fuse box may be shared by a plurality of memory macros. In such a case, a very large number of optical fuses are included in the fuse box.

At the level of actual products, most of the spare memory cells are left unused. In that case, the optical fuses corresponding to the unused spare memory cells are also left unused. As a result, when the data stored in all of the optical fuses is regarded as a bit string, an unprogrammed state "0 (the fuse is uncut)" appears consecutively more frequently than a programmed state "1 (the fuse is cut)". In the case of such biased data, data compression is very effective. Therefore, compressed data is programmed in the optical fuses. Then, the data is expanded at the time of data transfer. This enables the area of the fuse box to be reduced remarkably, even if a logic circuit for data expansion is added. A fuse box with such a logic circuit that expands the compressed programmed fuse data has been already proposed (for example, "Shared fuse macro for multiple embedded memory devices with redundancy", Proceedings of the IEEE 2001 Custom Integrated Circuits Conference, pp. 191–194, 2001).

When the term fuse is simply used, it usually means an optical fuse. There is another type of fuse known as an electrical fuse. An electrical fuse stores data by changing the state of an element electrically. Electrical fuses are divided into various types according to the elements used as fuses and the method of storing data. They includes a fuse that fuses the interconnection line by Joule heat generated by causing a large current to flow through the line and a fuse that destroys the insulating film of the element by applying a high voltage. An electrical fuse of the type that destroys the insulating film of the element is in the insulated state before data is written into the fuse and in the conducting state after data is written into the fuse. Therefore, this type of fuse is sometimes called anti-fuse.

Electrical fuses are chiefly used to relieve defective cells found in a test carried out after the chip is sealed into a package. They can also be used to tune the circuits. Therefore, use of electrical fuses is expected to improve the yield and therefore electrical fuses are requested to be mounted on the chips.

Use of electrical fuses doesn't necessarily mean that optical fuses are not required. For example, in the stage of wafers, optical fuses are used to relieve a large number of defective cells. A small number of defective cells occurred after the packaging are relieved by use of electrical fuses.

In a case where electrical fuses are mounted on a chip, when an attempt is made to distribute the electrical fuses in the inside of each memory macro in an ASIC, even if the fuses are to be used for a small number of defective cells, the following problem arises. When a large current or a high voltage is externally supplied, the number of connection terminals used is limited. Therefore, the power supply lines have to be connected in common to each memory macro. The power supply lines must be made very strong so as not to cause a voltage drop. There is a method of providing an internal high voltage generator near each memory macro. The high voltage generator, however, occupies a large circuit area. It is very undesirable to have a plurality of high voltage generators in a chip, although they are not used at all in an actual memory operation. Therefore, putting the electrical fuses together in a fuse box is effective.

The faulty addresses programmed in a plurality of fuses put together in a fuse box, or the so-called fuse data, are transferred from the fuse box to a memory macro at the time of initialization. When only optical fuses are present in the fuse box, the contents are simply transferred serially to the memory macro.

As shown in FIG. 15, when in a semiconductor integrated circuit device (or embedded memory), a single fuse box 101 is shared by a plurality of memory macros (DRAM Macro) 201, (DRAM macro) 202, and (SRAM Macro) 203, the individual memory macros 201, 202, 203 are connected in a daisy chain. This enables the fuse data to be sent through simple serial transfer.

However, when both optical fuses and electrical fuses are provided in the fuse box, it is necessary to know not only faulty addresses but also the time when the data in the electrical fuses is to be transferred. In that case, it is important to deal with all combinations corresponding to the types and configurations of memory macros, such as what number spare in what number DRAM macro, what number spare in another DRAM macro, and what number spare in what number SRAM macro. The number of such combinations is enormous. To change the hardware configuration of the fuse box according to all of the combinations requires the design and verification works each time a change is made, which is not desirable.

Concerning the transfer of fuse data, there is a method of separating an optical fuse data path from an electrical fuse data path. There is another method of replacing the data in the optical fuses with the data in the electrical fuses in a certain set of fuses. In those methods, however, the circuits for the fuse data paths in the memory macros are complicated. To prevent the circuits from being complicated, the number of fuse sets corresponding to the electrical fuses must be limited or spare memory cells only for electrical fuses have to be prepared additionally.

BRIEF SUMMARY OF THE INVENTION

According to an aspect of the present invention, there is provided a semiconductor integrated circuit device comprising a memory cell array in which a plurality of memory cells are arranged in an array, a redundant circuit which has a plurality of spare memory cells and replaces defective memory cells in the memory cell array with specific spare memory cells on the basis of programmed address information, a memory circuit with a plurality of nonvolatile memory elements in which the address information is programmed, a transfer circuit which transfers the address information programmed in the memory circuit to the redundant circuit and the operation of which is controlled according to command information programmed in the memory circuit.

BRIEF DESCRIPTION OF THE SEVERAL VIEWS OF THE DRAWING

FIG. 4 is a block diagram showing more concretely the configuration of a fuse box and a memory macro in the embedded memory of FIG. 1;

FIGS. 5A and 5B show examples of fuse data programmed in the fuses and transfer data actually transferred;

DETAILED DESCRIPTION OF THE INVENTION

Embodiments of the present invention will now be described with reference to the accompanying drawings.

First Embodiment

Figures 1, 3:
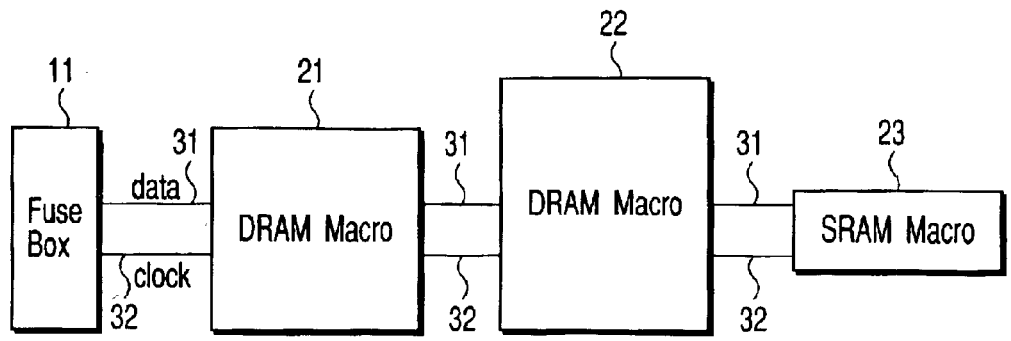
FIG. 1 is a block diagram showing an example of the configuration of a semiconductor integrated circuit device (or embedded memory) according to a first embodiment of the present invention.
FIG. 3 shows an example of command information prepared in the embedded memory of FIG. 1.

FIG. 1 shows an example of the configuration of a semiconductor integrated circuit device (or an embedded memory) according to a first embodiment of the present invention. In FIG. 1, a fuse box 11 constituting a memory transfer circuit section is shared by memory macros (semiconductor memory circuit sections) 21, 22, 23 of different types. In this case, the fuse box 11 and the individual memory macros 21, 22, 23 are connected in a daisy chain through a data line 31 and a transfer clock line 32. This enables address information for redundancy and other information to be transferred serially from the external fuse box 11 to the individual memory macros 21, 22, 23.

The fuse box 11 is composed of, for example, a plurality of fuses (or nonvolatile memory elements) for programming fuse data and a circuit necessary to read and transfer the fuse data.

As the fuses, either optical fuses (or a first nonvolatile memory element group) in which fuse data is programmed by fusing with laser light or electrical fuses (or a second nonvolatile memory element group) in which fuse data is programmed by changing the state electrically are used. The fuse data includes, for example, the address information and command information, which will be explained later, for controlling the transfer of the address information.

Each of the memory macros 21, 22, 23 is composed of a memory cell array and a redundant circuit and includes a shift register for storing address information. In the first embodiment, the memory macros 21, 22, 23 include a first DRAM Macro (21), a second DRAM Macro (22) differing in configuration from the first DRAM Macro (21), and an SRAM Macro (23), respectively.

The data line 31 is for transferring address information for redundancy and other information to each of the memory macros 21, 22, 23. The transfer of data including address information is controlled according to the command information programmed in the fuses.

The transfer clock line 32 is designed to be driven by the fuse box 11.

Figure 2A:
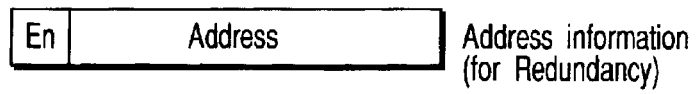
FIGS. 2A to 2E shows an example of fuse data in the embedded memory of FIG. 1.

FIGS. 2A to 2E show an example of the fuse data. Of the fuse data actually programmed in the fuses, address information for redundancy is composed of, for example, an enable bit "En" and an address "Address" as shown in FIG. 2A.

Figure 2B:

When defective cells are relieved with spares, "1" is set in the enable bit "En" (the programmed state) as address information as shown in FIG. 2B. Then, in the address "Address," a faulty address corresponding to the spare to be used is written.

Figure 2C:
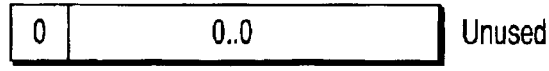

When a spare is unused, address information in this case is in the state where nothing is programmed in the enable bit "En" and address "Address" as shown in FIG. 2C, or where all the bits are set to "0".

Figure 2D:
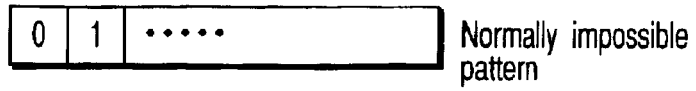

In the case of the fuse data, such address information as has specific pattern data beginning with "0, 1" as a header as shown in FIG. 2D is impossible. Thus, a bit string with the impossible pattern data "0, 1" as a header can be recognized as command information in distinction from address information.

This method is an example of discriminating between command information and address information. Another method may be used.

Figure 2E:
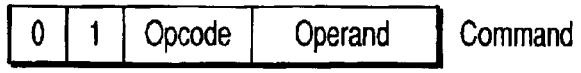

As shown in FIG. 2E, command information is composed of two fields: an operation code (Opcode) indicating the type of the command information and an operand, a target of command information, in addition to the header with the pattern data "0, 1".

What command information is prepared can be determined variously. In the first embodiment, explanation will be given about a case where the following three pieces of command information are prepared.

FIG. 3 shows an example of prepared command information (or a command set) in the first embodiment. In actual command information, "opcode" is a string of bits. For the sake of convenience, a name composed of a character string is used as a mnemonic. In "operand", a number is set. The meaning of the number is described in FIG. 3.

For example, Data Length is a command to set a data length (or the number of bits in the data). The command is for controlling a transfer circuit so that the circuit may check the header of the fuse data for each data length and determine whether the information is address information or command information.

Skip is a command to output "0" for a specific period (operand×data length). That is, Skip is for controlling a transfer circuit so as to create as much transfer data (or specific pattern data) meaning a spare is unused as is needed. This enables the area of the fuse box 11 to be decreased remarkably as a result of the compression of the fuse data.

NoEval is a command to prevent the header of the fuse data from being checked for a specific period (operand×data length). This command is provided on the assumption that it is used when random bit data, such as circuit tuning information, is transferred.

The configuration of the fuse box 11 and memory macros 21, 22, 23 will be explained in further detail.

FIG. 4 shows the configuration of the fuse box 11 and memory macros 21, 22, 23 more concretely. Explanation will be given, centering on the circuit blocks related to the transfer of fuse data.

In the fuse box 11, there are provided a plurality of fuses constituting a memory circuit. A fuse latch 13 is for reading the fuse data programmed in the individual fuses. A shift register 14 is for transferring the read-out fuse data serially. A data transfer logic 15 serving as a transfer circuit is for transferring the fuse data to the memory macros 21, 22, 23. The data transfer logic 15 is designed to decode the command when the fuse data is command information and create transfer data to be actually transferred.

In each of the memory macro 21, 22, 23, there are provided a memory cell array 24 and a redundant circuit 25. A shift register 26 is for storing the data sent from the fuse box 11 via the data line 31 and transfer clock line 32. In the memory cell array 24, a plurality of ordinary memory cells are arranged in an array. The redundant circuit 25 is composed of a plurality of spare memory cells prepared separately from the ordinary memory cells.

FIG. 5A shows an example of the fuse data programmed in the fuses 12 and FIG. 5B shows an example of transfer data to be actually transferred.

In the fuse data, a first command "Data Length" is for setting a data length. Therefore, the transfer data transferred from the data transfer logic 15 has nothing corresponding to "Data Length."

The next "data" is actually effective data (for redundancy). This data is transferred from the data transfer logic 15 directly to the memory macros 21, 22, 23.

The following command "Skip 6" is a command to skip 6 data items in the present data length. In the data transfer logic 15, when the command is executed, data "0" is transferred to the memory macros 21, 22, 23 for all of the bits in the 6 data items (Skip by command).

The next "data" is actually effective data. This data is transferred from the data transfer logic 15 directly to the memory macros 21, 22, 23.

The next command is "NoEval". When this command is executed, the data transfer logic 15 does not determine a specified data length worth of commands and transfers the data following those commands (for trimming)

The following command "Data Length" changes the data length. This command is based on the assumption that the type of a spare is changed at that point. After this and subsequent commands, the data length of the transfer data is changed. Therefore, the data in which all of the bits created in a subsequent command "Skip 7" have the value "0" is created on the basis of the data length.

The next "data" is actually effective data. This data is transferred from the data transfer logic 15 directly to the memory macros 21, 22, 23.

The following command "Skip 7" is a command, for example, to skip 7 data items in the present (or changed) data length. In the data transfer logic 15, when this command is executed, data "0" is transferred to the memory macros 21, 22, 23 for all of the bits in the 7 data items on the basis of the changed data length (Skip by command).

As described above, use of command "Skip" enables the effect of data compression to be improved on the whole, even if the overhead of the command is included. That is, when the command "Skip n" is used to control the data transfer logic 15, data "0" is created in all of the bits in n consecutive data items. As a result, all the bits in the n data items can be programmed as highly compressed data.

As described above, like the address information, the command information programmed in the fuse can control the operation of the data transfer logic. That is, when the command "Skip n" is used to control the data transfer logic, data "0" can be created for all of the bits in n consecutive data items. This enables all of the bits in the n data items to be programmed as data with a high compression rate. Consequently, it is possible to reduce the area of the fuse box by the compression of the fuse data.

Use of commands programmed in the fuses makes it possible not only to compress the address information but also to deal flexibly with various memory configurations without changing the hardware configuration of the fuse box.

Second Embodiment

Figure 6:
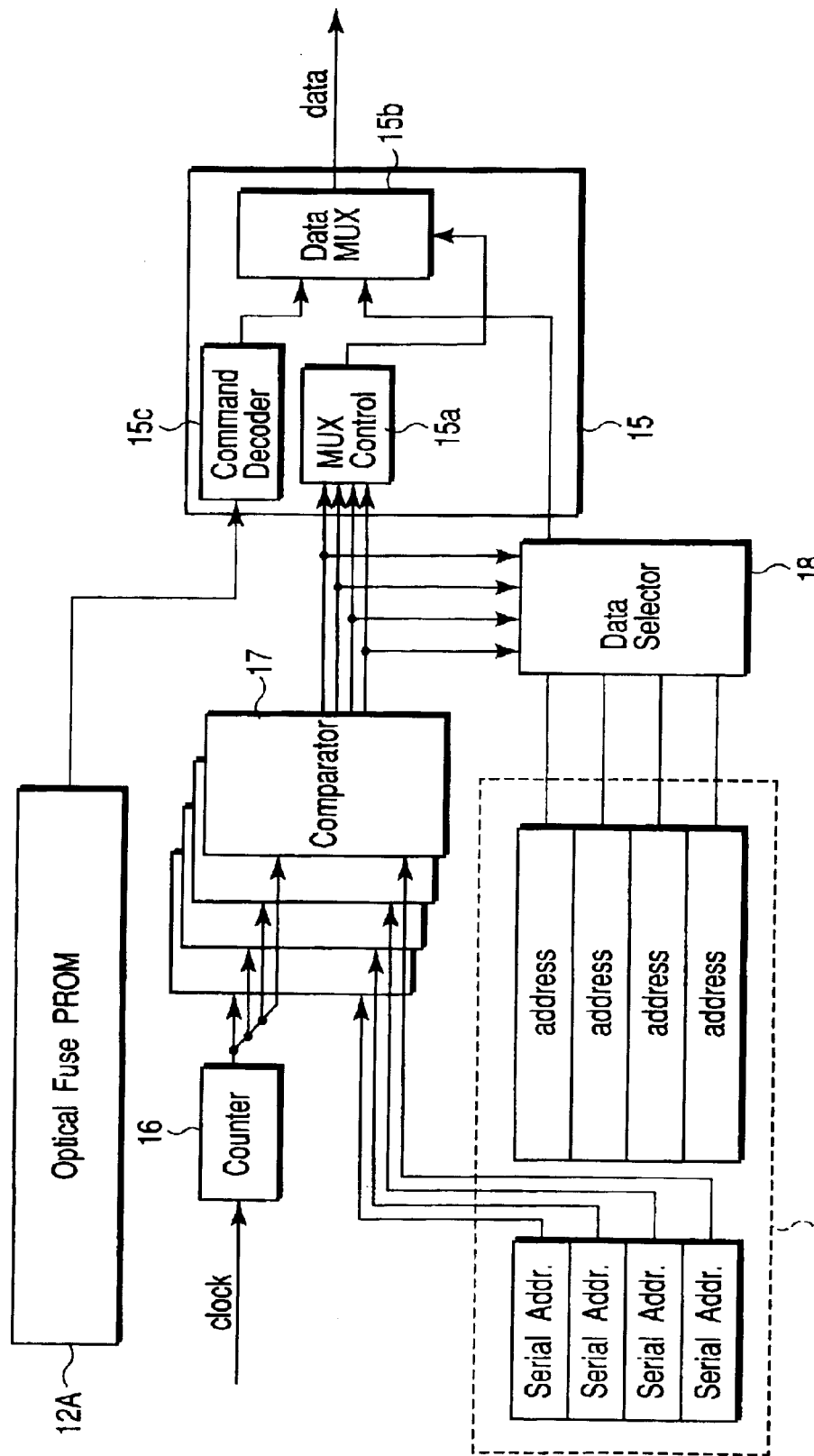
FIG. 6 is a block diagram showing an example of the configuration of a fuse box used in a semiconductor integrated circuit device (or an embedded memory) according to a second embodiment of the present invention.

FIG. 6 shows an example of the configuration of a fuse box used in a semiconductor integrated circuit device (or an embedded memory) according to a second embodiment of the present invention. In the second embodiment, the fuses 12 include both optical fuses and electrical fuses. Explanation will be given about a case where the data in the optical fuses (a first group) is replaced with the data in the electrical fuses (a second group).

Hereinafter, in the second embodiment, information about what number bit in the bit string is the data to be outputted is assumed to be called serial address (control data). That is, for the data transfer logic to transfer the data in the electrical fuses, two pieces of information, the faulty address and the serial address indicating when the faulty address is to be sent, are needed.

When the serial address is fixed in hardware, a high-flexibility replacement cannot be made with various memory configurations. Therefore, the serial address has to be programmed using the electrical fuses.

As shown in FIG. 6, a memory circuit includes a PROM (Optical Fuse PROM) 12A composed of a plurality of optical fuses, a first nonvolatile memory element group and a PROM (Electrical Fuse PROM) 12B composed of a plurality of electrical fuses, a second nonvolatile memory element group. The PROM 12A stores faulty address information and command information, which are data in optical fuses to be transferred actually. The PROM 12B has two fields: one of which stores a serial address (Serial Addr.) with which the transfer of the data in the electrical fuses is to be started and the other of which stores faulty address information, the data to be transferred actually.

A counter 16 counts the transfer clock supplied externally.

A comparator 17 compares the count output of the counter 16 with the serial address in the PROM 12B. According to the result of the comparison, a data selector 18 and an MUX controller (MUX Control) 15a in the data transfer logic 15 are controlled.

A data selector 18 outputs the faulty address information in the PROM 12B according to the result of the comparison at the comparator 17 to a data MUX 15b in the data transfer logic 15.

To the data MUX 15b, the data in the optical fuses of the PROM 12A is transferred serially via a command decoder 15c.

The MUX controller 15a controls the data MUX 15b in the data transfer logic 15 according to the result of the comparison at the comparator 17.

Under the control of the MUX controller 15a, the data MUX 15b switches between the transfer of the data in the optical fuses of the PROM 12A and the transfer of the data in the electrical fuses of the PROM 12B. For example, when the serial address programmed in the PROM 12B coincides with the count output of the counter 16, the output of the corresponding comparator 17 is activated. This causes the MUX controller 15a to control the data MUX 15b so as to transfer the faulty address information from the corresponding electrical fuses.

Since the serial address indicates only the beginning of the data change, the control of the MUX controller 15a return to the initial control mode after the necessary number of bits have been transferred. As the necessary number of bits, the present setting value of the data length programmed in the optical fuses as command "Data Length" is used.

Figure 7:
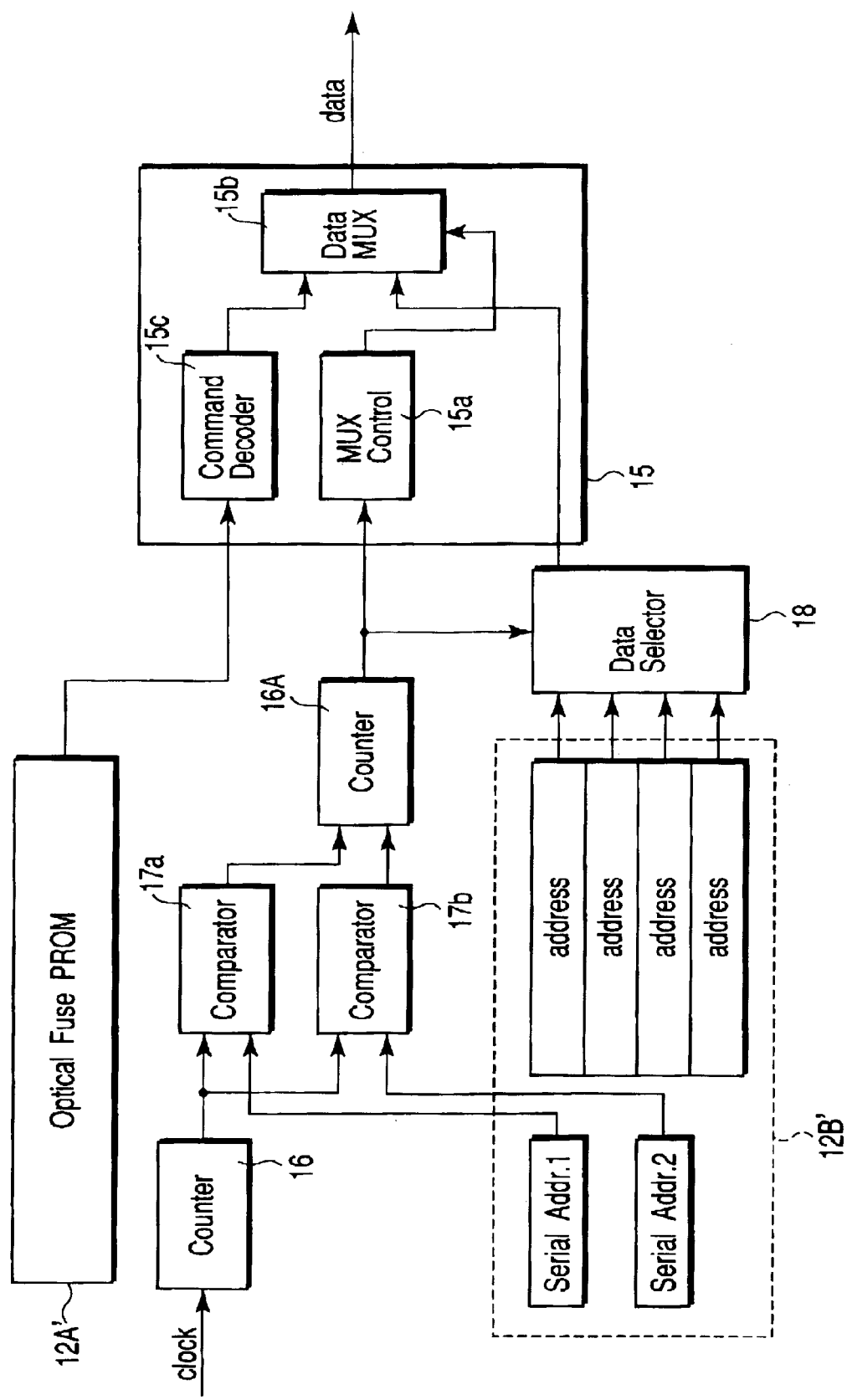
FIG. 7 is a block diagram showing another example of the configuration of the fuse box.

The fuse box may be modified such that fault address information items, which are not serial addresses, are automatically inserted at specific intervals as illustrated in FIG. 7. More specifically, the serial addresses stored in the PROM 12B' do not have one-to-one relation to fault address information items. Rather, each serial address represents the start and end of a period during which data should be transferred from an electrical fuse. In this case, a counter 16A is used in addition to the counter 16 that provide a total count. The counter 16A start operating when it receives an output from a comparator 17a and stops operating when it receives an output from a comparator 17b. The comparator 17a compares the count that the counter 16 has made, with the serial address (Serial Addr.1) stored in the PROM 12B'. The comparator 17b compares the count that the counter 16 has made, with the serial address (Serial Addr.2) stored in the PROM 12B'. The count output from the counter 16A controls the data selector 18 and the MUX controller 15a incorporated in the data transfer logic 15.

If the fuse box is thus modified, Serial Addr.1 defines the time at which the counter 16A should start operating, and Serial Addr.2 defines the time at which the counter 16A stops operating. In other words, the counter 16A starts in accordance with Serial Addr.1 and stops in accordance with Serial Addr.2. Thus, the data from any effective electrical fuse can be automatically inserted at the position of the serial address to which the data should be transferred.

Figure 8:
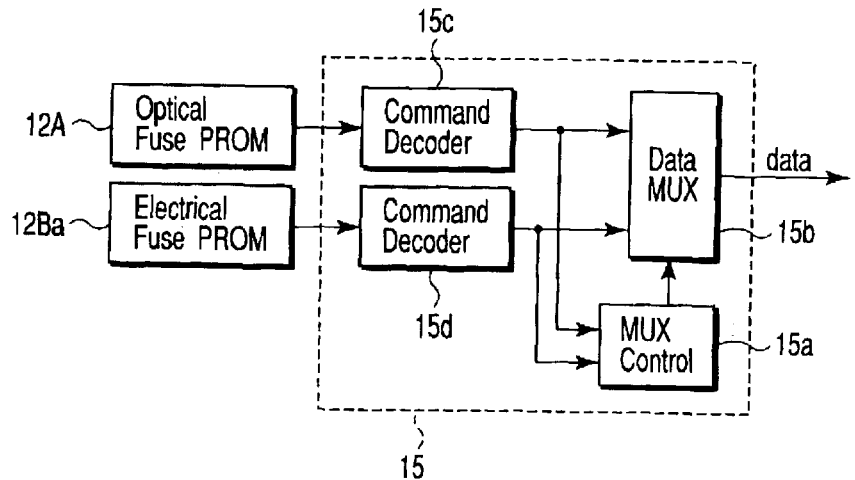
FIG. 8 is a block diagram showing still another example of the configuration of the fuse box shown in FIG. 6.

Furthermore, as shown in FIG. 8, the fuse box may be so configured that PROM 12Ba on the electrical fuse side transfers the data serially as PROM 12A on the optical fuse side does. In that case, a command decoder 15d for executing the command information programmed in the electrical fuses in PROM 12Ba is added to the data transfer logic 15. Thus, necessary commands "Skip" are programmed in the electrical fuses in the PROM 12Ba, thereby bringing the data in the effective electrical fuses to the positions of the serial addresses to which the data should be transferred.

Figure 9A:
FIGS. 9A to 9E show an example of fuse data and its decode data in the fuse box with the configuration of FIG. 8.
Figure 9B:
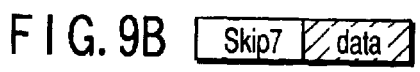
Figure 9C:
Figure 9D:
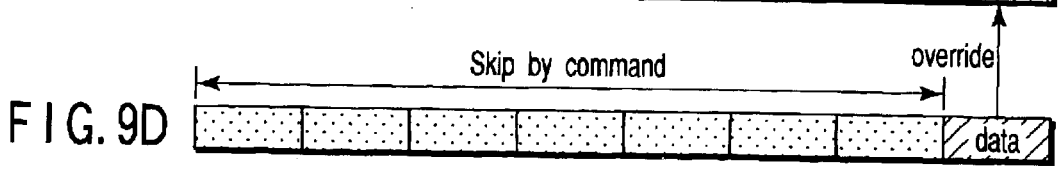
Figure 9E:

FIGS. 9A to 9E show each fuse data item in the configuration of FIG. 8 and decode data for each fuse data. FIG. 9A shows the contents (the data in the optical fuses) of the PROM 12A on the optical fuse side. FIG. 9B is the contents (the data in the electrical fuses) of the PROM 12Ba on the electrical fuse side. FIG. 9C is decode data obtained by decoding the data in the optical fuses at the command decoder 15c. FIG. 9D is decode data obtained by decoding the data in the electrical fuses at the command decoder 15d. FIG. 9E is transfer data created at the data MUX 15b on the basis of each decode data item and actually transferred to a memory macro.

As described above, when the data in the electrical fuses is effective (or when Enable bit has the value "1"), the data MUX 15b is so controlled that the data in the electrical fuses is transferred in place of the data in the optical fuses. As a result, part of the faulty address information in the optical fuse is replaced with the faulty address information in an effective electrical fuses and the resulting information is transferred to a memory macro.

Third Embodiment

Figures 10, 11:
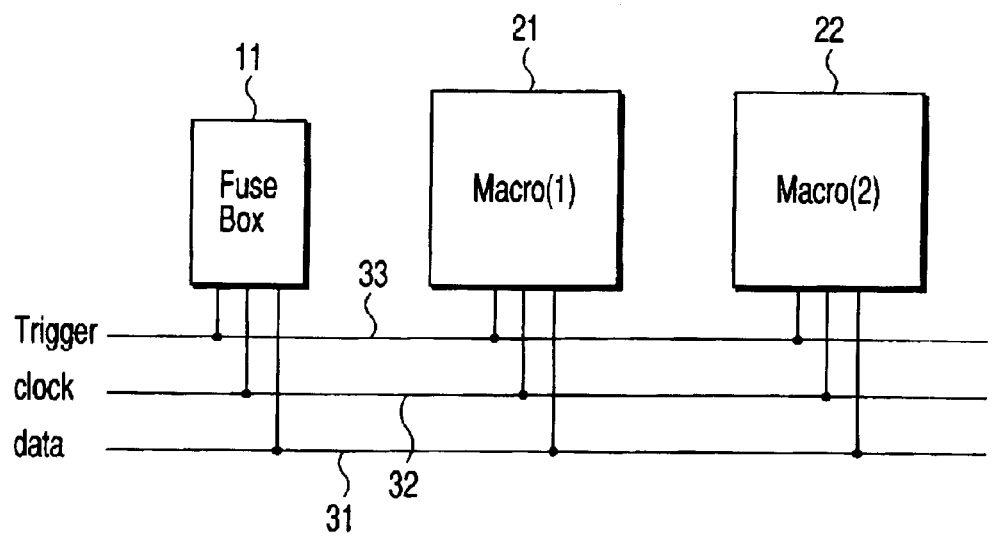
FIG. 10 shows an example of command information prepared in an embedded memory according to a third embodiment of the present invention.
FIG. 11 is a block diagram showing an example of the configuration of a semiconductor integrated circuit device (or an embedded memory) using the command information of FIG. 10.

FIG. 10 shows an example of prepared command information in a third embodiment of the present invention. In the third embodiment, explanation will be given about a case where another command "Trigger" is further provided in addition to the above three commands, "Data Length", "Skip", and "NoEval".

The command "Trigger" is a command to output, for example, a macro ID (or a unique identification code) unique to each memory macro. This command is used to control the reception of data in a specific memory macro corresponding to a macro ID.

FIG. 11 shows an example of a semiconductor integrated circuit device (or an embedded memory) in a case where the four commands shown in FIG. 10 can be used. In FIG. 11, a fuse box 11 constituting a memory transfer circuit section is shared by a plurality of memory macros (semiconductor memory circuit sections) 21, 22 differing in type. In this case, the fuse box 11 and the individual memory macros 21, 22 are connected through a bus, using a data line 31, a transfer clock line 32, and a signal line (Trigger) 33. That is, the fuse box 11 and the individual memory macros 21, 22 are each connected to the data line 31, transfer clock line 32, and signal line 33. This enables address information for redundancy and other information to be transferred from the external fuse box 11 to the individual memory macros 21, 22.

The fuse box 11 is composed of, for example, a plurality of fuses (nonvolatile memory elements) for programming fuse data and a circuit necessary to read and transfer the fuse data.

As the fuses, either optical fuses (or a first nonvolatile memory element group) in which fuse data is programmed by fusing with laser light or electrical fuses (or a second nonvolatile memory element group) in which fuse data is programmed by changing the state electrically are used. The fuse data includes, for example, the address information and command information for controlling the transfer of the address information.

Each of the memory macros 21, 22 is composed of a memory cell array and a redundant circuit and includes a shift register for storing address information. In the third embodiment, the memory macros 21, 22 include a first DRAM Macro and a second DRAM Macro differing in configuration from the first DRAM Macro or an SRAM Macro, respectively.

Furthermore, each of the memory macros 21, 22 is given a unique macro ID. For example, "ID=1" is given to the memory macro 21. "ID=2" is given to the memory macro 22. Therefore, the fuse box 11 specifies the macro ID, thereby controlling the reception of data with the memory macro 21 or 22. For example, the fuse box 11 can perform control in such a manner that only the memory macro whose macro ID coincides with the specified ID starts to take in the data.

The data line 31 is for transferring address information for redundancy and other information to the memory macros 21, 22. The transfer of data including address information is controlled according to the command information programmed in the fuses.

The transfer clock line 32 is designed to be driven by the fuse box 11.

The signal line 33 is activated to cause the macro ID included in the command information programmed in the fuses to be loaded into the individual memory macros 21, 22.

Figure 12:
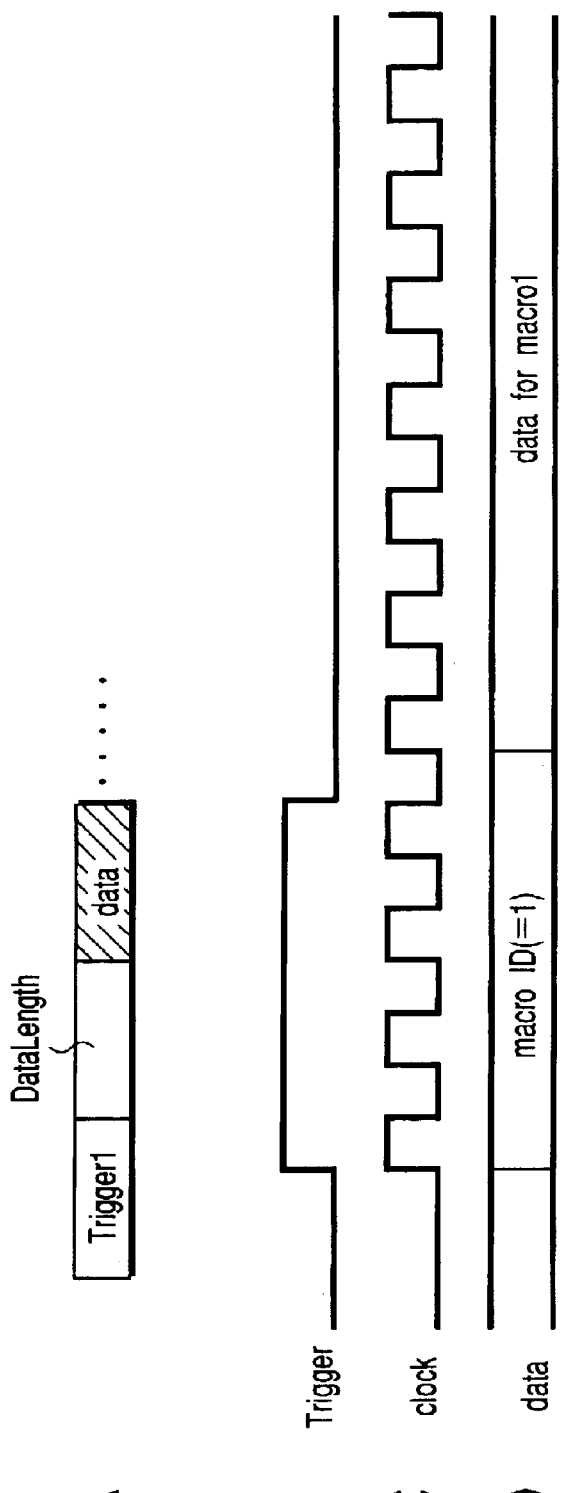
FIGS. 12A to 12D are diagrams to explain the operation of the embedded memory of FIG. 11.

With the above configuration, it is assumed that command information as shown in, for example, FIG. 12A is programmed in the fuses in the fuse box 11. Moreover, it is assumed that the data transfer logic in the fuse box 11 executes command "Trigger". Then, not only is the signal line 33 activated as shown in FIG. 12B, but also the macro ID (e.g., ID=1) is outputted onto the data line 31 as shown in FIG. 12D.

Then, the individual memory macros 21, 22 take in the macro ID transferred over the data line 31 and compares it with their macro ID. The memory macro whose macro ID coincides with the taken-in macro ID (in this case, the memory macro 21) takes in the data (data for macro 1) following the macro ID. On the other hand, the memory macro whose macro ID does not coincide with the taken-in macro ID (in this case, the memory macro 22) does not take in the data.

As described above, use of command "Trigger" enables the fuse box 11 and the individual memory macros 21, 22 to be connected through a bus. This makes it possible to control the reception of the data with the memory macro 21 or 22 corresponding to the macro ID by specifying the unique macro ID previously allocated to the memory macro 21 or 22.

Furthermore, a plurality of fuse boxes may be connected to a common bus.

Figure 13:
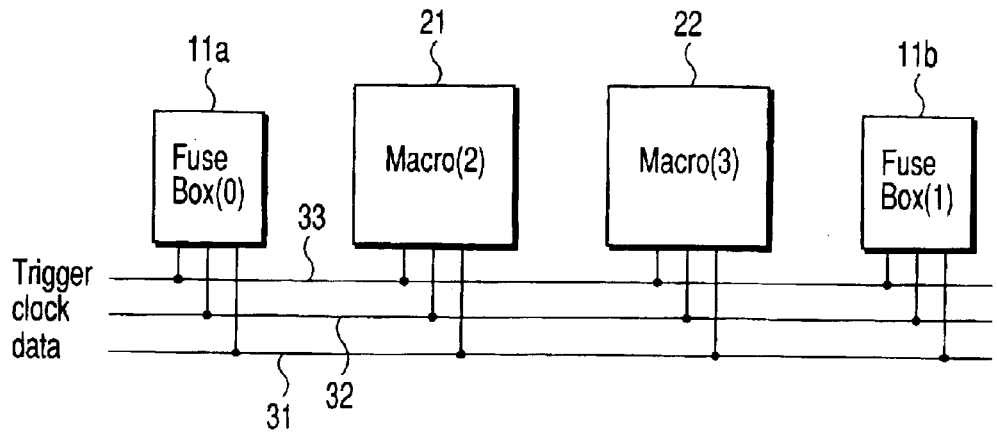
FIG. 13 is a block diagram of a semiconductor integrated circuit device (or an embedded memory) in a case where the device is composed of a plurality of fuse boxes.

FIG. 13 shows a case where a plurality of fuse boxes are provided in a semiconductor integrated circuit device (or an embedded memory) with the configuration shown in FIG. 11. As shown in FIG. 13, fuse boxes 11a, 11b constituting a memory transfer circuit section and a plurality of memory macros (semiconductor memory circuit sections) 21, 22 differing in type are connected through a bus, using the data line 31, transfer clock line 32, and signal line (Trigger) 33. This enables address information for redundancy and other information to be transferred from the external fuse boxes 11a, 11b to the individual memory macros 21, 22.

The fuse boxes 11a, 11b are composed of, for example, a plurality of fuses (or nonvolatile memory elements) for programming fuse data and a circuit necessary to read and transfer the fuse data.

As the fuses, either optical fuses (or a first nonvolatile memory element group) in which fuse data is programmed by fusing with laser light or electrical fuses (or a second nonvolatile memory element group) in which fuse data is programmed by changing the state electrically are used. The fuse boxes 11a, 11b of the same type have been assigned unique fuse IDs respectively. For example, "ID=0" is given to the fuse box 11a and "ID=1" is given to the fuse box 11b.

The memory macros 21, 22 include a first DRAM Macro and a second DRAM Macro differing in configuration from the first DRAM Macro or an SRAM Macro, respectively. Furthermore, each of the memory macros 21, 22 has been given a unique macro ID. For example, "ID=2" has been given to the memory macro 21. "ID=3" has been given to the memory macro 22.

As shown in FIG. 13, when there are a plurality of fuse boxes 11a, 11b, for example, the fuse ID for the fuse box 11a to operate first is determined to be "0" in advance. Then, in the fuse box 11a, command "Trigger" is programmed at the end of the data. In its "Operand", the fuse ID (=1) for the fuse box 11b is specified.

Thereafter, bus control is passed to the fuse box 11b. This enables each of the fuse boxes 11a, 11b to transfer data independently, even when a plurality of fuse boxes 11a, 11b are connected to a common bus.

With such a configuration, a plurality of fuse boxes can be arranged freely on the common bus, which enables a more flexible arrangement. Furthermore, it is possible to combine a plurality of fuse boxes. As a result, just preparing fuse boxes of a small number of types makes it possible to cope with various systems.

Fourth Embodiment

Figure 14:
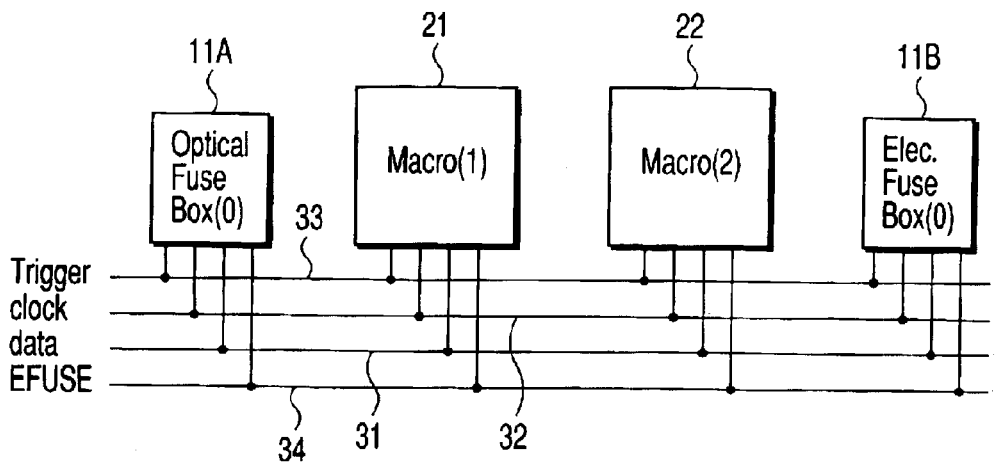
FIG. 14 is a block diagram showing an example of the configuration of semiconductor integrated circuit device (or an embedded memory) according to a fourth embodiment of the present invention.
Figure 15:
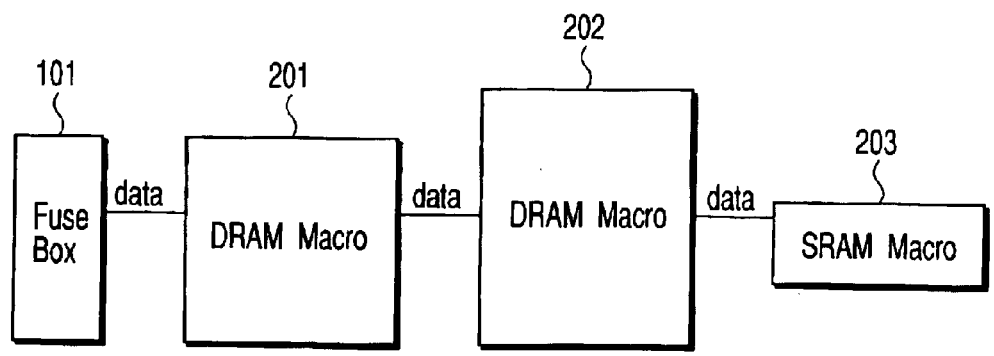
FIG. 15 is a block diagram of a semiconductor integrated circuit device (or an embedded memory) to explain the prior art and problems of the prior art.

FIG. 14 shows an example of the configuration of a semiconductor integrated circuit device (or an embedded memory) according to a fourth embodiment of the present invention. In FIG. 14, fuse boxes 11A, 11B constituting a memory transfer circuit section and a plurality of memory macros (or semiconductor memory circuit sections) 21, 22 differing in type are connected through a bus, using a data line 31, a transfer clock line 32, a signal line (Trigger) 33, and a signal line (EFUSE) 34. This enables address information for redundancy and other information to be transferred from the external fuse boxes 11A, 11B to the individual memory macros 21, 22.

Each of the fuse boxes 11A, 11B is composed of, for example, a plurality of fuses (or nonvolatile memory elements) for programming fuse data and a circuit necessary to read and transfer the fuse data. Of the fuse foxes 11A, 11B, for example, the optical-fuse-only fuse box (Optical Fuse Box) 11A is composed of a plurality of optical fuses (a first nonvolatile memory element group) in which fuse data is programmed by fusing with laser light. The fuse box 11A operates almost in the same manner as the fuse box 11 shown in the first embodiment. The electrical-fuse-only fuse box (Elec. Fuse Box) 11B differing in type from the fuse box 11A is composed of a plurality of electrical fuses (a second nonvolatile memory element group) in which fuse data is programmed by changing the state electrically. The fuse box 11B, in which no clock is in operation, operates in synchronization with the clock from the fuse box 11A.

Each of the memory macros 21, 22 is composed of a memory cell array and a redundant circuit and includes a shift register for storing address information. In the fourth embodiment, the memory macros 21, 22 include a first DRAM Macro and a second DRAM Macro differing in configuration from the first DRAM Macro or an SRAM Macro, respectively. Furthermore, each of the memory macros 21, 22 is given a unique macro ID in advance. For example, "ID=1" is given to the memory macro 21. "ID=2" is given to the memory macro 22.

The data line 31 is for transferring address information for redundancy and other information to the memory macros 21, 22. The transfer of data including address information is controlled according to the command information programmed in the fuses.

The transfer clock line 32 is designed to be driven by the fuse box 11A.

The signal line 33 is activated to cause the macro ID included in the command information programmed in the fuses to be transferred to the individual memory macros 21, 22.

The signal line 34 is activated when priority is given to the data transfer from the electrical fuses.

With the above configuration, when priority is given to the data transfer from the electrical fuses over the data transfer from the optical fuses, that is, when data transfer is to be carried out using the serial addresses programmed in the fuse box 11B, the signal line 34 is activated first. The fuse box 11A is stopped from outputting the data to the outside world, while the signal line 34 is being activated. The other operations are the same as in the third embodiment.

As described above, while the signal line 34 is being activated, bus control is passed to the fuse box 11B. This makes it possible to connect the fuse boxes 11A, 11B differing in type to a common bus. That is, even when a plurality of fuse boxed 11A, 11B differing in type are connected to a common bus, each of the fuse boxes 11A, 11B can transfer the data independently.

With the fourth embodiment, each of the optical-fuse-only fuse box and electrical-fuse-only fuse box can be made a fuse box used exclusively for a separate memory macro. Consequently, just preparing fuse boxes of a minimum number of types enables various combinations and more flexible arrangements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    a memory cell array in which a plurality of memory cells are arranged in an array;
    a redundant circuit which has a plurality of spare memory cells and replaces defective memory cells in the memory cell array with specific spare memory cells on the basis of programmed address information;
    a memory circuit with a plurality of nonvolatile memory elements in which the address information is programmed;
    a register to which the address information programmed in the memory circuit is transferred; and
    a transfer circuit which transfers the address information to the register and the operation of which is controlled according to command information programmed in the memory circuit.

2. The semiconductor integrated circuit device according to claim 1, wherein the command information has a header, the header being specific pattern data which distinguishes the command information from the address information.

3. The semiconductor integrated circuit device according to claim 1, wherein the command information includes a command to output specified pattern data a plurality of times.

4. The semiconductor integrated circuit device according to claim 1, wherein the redundant circuit replaces defective memory cells with specific spare memory cells or a set of memory cells including defective memory cells with a set of specific spare memory cells.

5. The semiconductor integrated circuit device according to claim 1, wherein the memory circuit includes either a first nonvolatile memory element group in which the address information and the command information are programmed by fusing with laser light or a second nonvolatile memory element group in which the address information and the command information are programmed by changing the state electrically.

6. The semiconductor integrated circuit device according to claim 1, wherein the memory circuit includes a first nonvolatile memory element group in which the address information and the command information are programmed by fusing with laser light and a second nonvolatile memory element group in which the address information and the command information are programmed by changing the state electrically.

7. The semiconductor integrated circuit device according to claim 6, wherein the address information includes a first group programmed in the first nonvolatile memory element group and a second group programmed in the second nonvolatile memory element group, and the transfer circuit has the function of replacing part of the address information in one group with the address information in the other group and transferring the resulting information.

8. The semiconductor integrated circuit device according to claim 7, wherein the second nonvolatile memory element group further stores control data which causes the transfer circuit to switch between the transfer of the address information in the first group and the transfer of the address information in the second group.

9. The semiconductor integrated circuit device according to claim 7, wherein the second nonvolatile memory element group has command information programmed therein, the command information being used to cause the transfer circuit to switch between the transfer of the address information in the first group and the transfer of the address information in the second group.

10. The semiconductor integrated circuit device according to claim 1, wherein the memory cell array, the redundant circuit and the register comprise a semiconductor memory circuit section, and the memory circuit and the transfer circuit comprise a memory transfer circuit section, which is connected to the semiconductor memory circuit section in a daisy chain.

11. The semiconductor integrated circuit device according to claim 10, wherein the memory transfer circuit section supplies the address information and the command information from the outside of the semiconductor memory circuit section.

12. The semiconductor integrated circuit device according to claim 11, wherein the semiconductor memory circuit section includes a plurality of memory macros.

13. The semiconductor integrated circuit device according to claim 12, wherein the command information includes a command to control the reception of the data in the memory macro specified by one of the unique identification codes previously assigned to the plurality of memory macros.

14. The semiconductor integrated circuit device according to claim 13, wherein the plurality of memory macros have the function of starting to receive the data when the identification codes coincides.

15. The semiconductor integrated circuit device according to claim 1, wherein the memory cell array and the redundant circuit comprise a semiconductor memory circuit section, and the memory circuit, the transfer circuit and the register comprise a memory transfer circuit section, which is connected to the semiconductor memory circuit section through a bus.

16. The semiconductor integrated circuit device according to claim 15, wherein the memory transfer circuit section supplies the address information and the command information from the outside of the semiconductor memory circuit section.

17. The semiconductor integrated circuit device according to claim 16, wherein the semiconductor memory circuit section includes a plurality of memory macros.

18. The semiconductor integrated circuit device according to claim 17, wherein the command information includes a command to control the reception of the data in the memory macro specified by one of the unique identification codes previously assigned to the plurality of memory macros.

19. The semiconductor integrated circuit device according to claim 18, wherein the plurality of memory macros have the function of starting to receive the data when the identification codes coincides.

20. The semiconductor integrated circuit device according to claim 16, wherein the memory transfer circuit section includes a plurality of fuse boxes of the same type.

21. The semiconductor integrated circuit device according to claim 16, wherein the memory transfer circuit section includes a plurality of fuse boxes differing in type.

* * * * *